(12) United States Patent
Okamoto et al.

(10) Patent No.: US 9,919,508 B2
(45) Date of Patent: Mar. 20, 2018

(54) SUBSTRATE ALIGNING APPARATUS, SUBSTRATE BONDING APPARATUS, SUBSTRATE ALIGNING METHOD AND SUBSTRATE BONDING METHOD

(71) Applicant: NIKON CORPORATION, Tokyo (JP)

(72) Inventors: Kazuya Okamoto, Yokohama (JP); Isao Sugaya, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 99 days.

(21) Appl. No.: 14/695,621

(22) Filed: Apr. 24, 2015

(65) Prior Publication Data

US 2015/0231873 A1    Aug. 20, 2015

Related U.S. Application Data

(63) Continuation of application No. PCT/JP2013/006334, filed on Oct. 25, 2013.

(30) Foreign Application Priority Data

Oct. 26, 2012    (JP) ................. 2012-236841

(51) Int. Cl.
*B32B 41/00*    (2006.01)
*B32B 38/18*    (2006.01)
(Continued)

(52) U.S. Cl.
CPC .......... *B32B 41/00* (2013.01); *B32B 37/0046* (2013.01); *B32B 37/18* (2013.01); *B32B 38/18* (2013.01)

(58) Field of Classification Search
CPC ..... B32B 41/00; B32B 37/18; B32B 37/0046; B32B 38/18
(Continued)

(56) References Cited

U.S. PATENT DOCUMENTS 7,682,933 B1    3/2010    Loomis
2009/0068765 A1    3/2009    Murooka
(Continued)

FOREIGN PATENT DOCUMENTS

CN    102656678 A    9/2012
JP    2005-251972    9/2005
(Continued)

OTHER PUBLICATIONS

Supplementary European Search Report issued by the European Patent Office in counterpart European Application No. EP 13 84 98 22, dated May 24, 2016 (8 pages).
(Continued)

*Primary Examiner* — Michael N Orlando
*Assistant Examiner* — Joshel Rivera
(74) *Attorney, Agent, or Firm* — Finnegan, Henderson, Farabow, Garrett & Dunner, LLP

(57) ABSTRACT

A substrate aligning apparatus comprising: an aligning section that aligns a first substrate and a second substrate together; an acquiring section that acquires positional information on at least one of the first substrate and the second substrate, by the time the first substrate and the second substrate which have been aligned in the aligning section are carried out from the aligning section; a judging that judges misalignment of the first substrate and the second substrate, based on information acquired by the acquiring section.

25 Claims, 9 Drawing Sheets

(51) Int. Cl.
*B32B 37/00* (2006.01)
*B32B 37/18* (2006.01)

(58) Field of Classification Search
USPC .......................... 156/64, 350, 351, 378, 379
See application file for complete search history.

(56) References Cited

U.S. PATENT DOCUMENTS

2010/0168908 A1 7/2010 Maeda et al.
2012/0255365 A1 10/2012 Wimplinger

FOREIGN PATENT DOCUMENTS

| JP | 2008-172093 | 7/2008 |
| JP | 2010-87377 | 4/2010 |
| JP | 2011-49450 | 3/2011 |
| JP | 2012-138423 | 7/2012 |
| JP | 2011-049450 A1 | 9/2012 |
| JP | 2013-519240 | 5/2013 |
| TW | 201009994 A1 | 1/2010 |
| TW | 2010-24946 | 7/2010 |
| WO | WO 2008/156152 A1 | 12/2008 |
| WO | WO 2010/023935 A1 | 4/2010 |

OTHER PUBLICATIONS

International Search Report issued by the Japanese Patent Office in International Application No. PCT/JP2013/006334, dated Jan. 7, 2014 (4 pages).
International Search Report on Patentability and Written Opinion of the International Searching Authority issued by the Japanese Patent Office in International Application No. PCT/JP2013/006334, dated Jan. 7, 2014 (5 pages).
Notification of First Office Action issued by the State Intellectual Property Office of the People's Republic of China in a counterpart Application No. 201380056169.2 dated Oct. 9, 2016, and English translation thereof.
Office Action issued by the Taiwan Intellectual Property Office in a counterpart Application No. 102138614 dated Mar. 16, 2017, and English translation thereof.
Office Action issued by the State Intellectual Property Office of the People's Republic of China in a counterpart Application No. 201380056169.2 dated Jun. 20, 2017, and English translation thereof.
Office Action issued by the Japanese Patent Office dated Oct. 17, 2017 in counterpart Japanese Application No. 2014-543158, and English translation thereof.
Office Action issued by the Taiwan Intellectual Property Office dated Nov. 28, 2017 in counterpart Taiwanese Application No. 102138614, and English translation thereof.

SUBSTRATE ALIGNING APPARATUS, SUBSTRATE BONDING APPARATUS, SUBSTRATE ALIGNING METHOD AND SUBSTRATE BONDING METHOD

The contents of the following Japanese and International patent applications are incorporated herein by reference:
No. 2012-236841 filed on Oct. 26, 2012, and
No. PCT/JP2013/006334 filed on Oct. 25, 2013.

BACKGROUND

1. Technical Field

The present invention relates to a substrate aligning apparatus, a substrate bonding apparatus, a substrate aligning method and a substrate bonding method.

2. Related Art

An aligning apparatus which aligns a pair of substrates by means of alignment marks or the like is known (e.g., see Patent Document 1).

[Patent Document 1] Japanese Patent Application Publication No. 2005-251972

However, there is a problem that misalignment of substrates may occur even though the substrates are precisely aligned together due to the factors after the alignment.

SUMMARY

According to a first aspect of the present invention, provided is a substrate aligning apparatus comprising: an aligning section that aligns a first substrate and a second substrate together; an acquiring section that acquires positional information on at least one of the first substrate and the second substrate, by the time the first substrate and the second substrate which have been aligned in the aligning section are carried out from the aligning section; a judging section that judges misalignment of the first substrate and the second substrate, based on information acquired by the acquiring section.

According to a second aspect of the present invention, provided is a substrate aligning apparatus comprising: an aligning section that aligns a pair of substrates; a holding section that holds at least one of the pair of substrates; and a judging section that judges whether there is misalignment of the pair of substrates which has been aligned by the aligning section, based on positional information of the holding section.

According to a third aspect of the present invention, provided is a substrate bonding apparatus comprising: the substrate aligning apparatus described above; and a stacking section that stacks the first substrate and the second substrate together which have been aligned on the aligning apparatus.

According to a fourth aspect of the present invention, provided is as substrate aligning method comprising: aligning a first substrate and a second substrate together in an aligning section; acquiring positional information on at least one of the first substrate and the second substrate, by the time the first substrate and the second substrate which have been aligned in the alignment are carried out from the aligning section; and judging misalignment of the first substrate and the second substrate based on information acquired in the acquisition.

According to a fifth aspect of the present invention, provided is a substrate aligning method comprising: aligning a pair of substrates in an aligning section; judging whether there is misalignment of the pair of substrates that have been aligned in the alignment, based on positional information of a holding section that holds at least one of the pair of substrates.

According to a sixth aspect of the present invention, provided is a substrate bonding method comprising: the substrate aligning method described; and stacking the first substrate and the second substrate together that have been aligned by the aligning method.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, an embodiment of the present invention will be described. The embodiment does not limit the invention according to the claims, and all the combinations of the features described in the embodiment are not necessarily essential to means provided by aspects of the invention.

Figure 1:
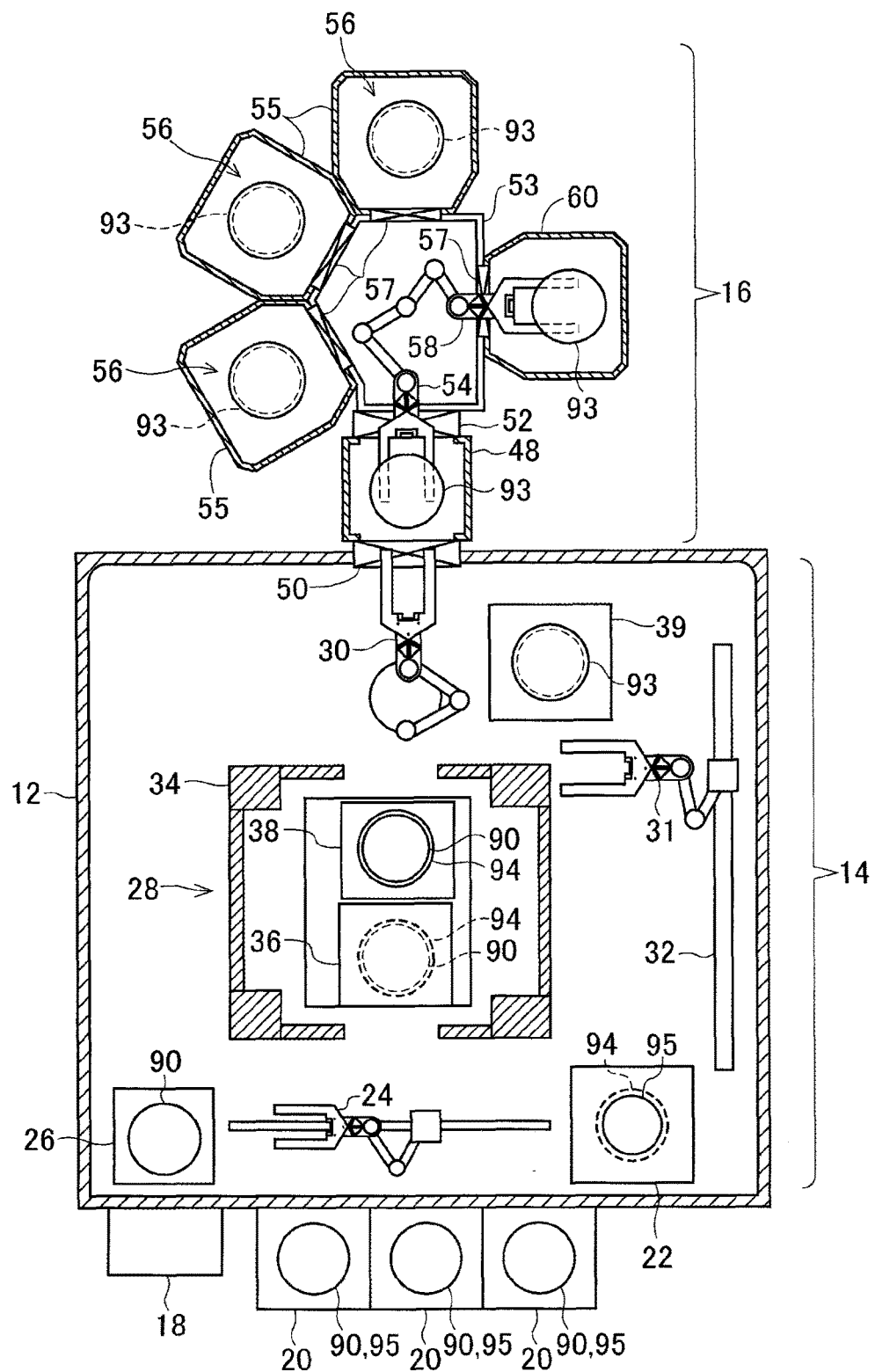
FIG. 1 is an entire configuration diagram of a substrate bonding apparatus 10.

FIG. 1 is an entire configuration diagram of a substrate bonding apparatus 10. A substrate bonding apparatus 10 manufactures bonding substrates 95 by bonding two pieces of substrate 90, 90.

In addition, the substrate bonding apparatus 10 may manufacture the bonding substrates 95 by bonding 3 or more pieces of substrate 90.

As shown in FIG. 1, the substrate bonding apparatus 10 comprises an atmosphere environment section 14, vacuum environment section 16, control section 18, and plurality of substrate cassettes 20. The control section 18 controls the whole operation of the substrate bonding apparatus 10.

The substrate cassettes 20 contain the substrates 90 and bonding substrates 95. The substrates 90 to be bonded by the substrate bonding apparatus 10 may be a single silicon wafer, compound semiconductor wafer, glass substrate and the like, with or without an element, circuitry, a terminal or the like formed thereon.

The atmosphere environment section 14 comprises an environment chamber 12, a substrate holder rack 22, robot arms 24, 30, 31, a pre-aligner 26, an alignment apparatus 28 as an example of an aligning apparatus, a rail 32 and a separation stage 39. The environment chamber 12 is formed so as to surround the atmosphere environment section 14. The area surrounded by the environment chamber 12 is communicated to an air adjusting machine o the like to manage temperature.

The substrate holder rack 22 contains multiple pairs of substrate holders 94 to hold the stacked substrates 90 and the bonding substrates 95 from upper and lower directions. The substrate holder 94 holds the substrates 90 by electrostatic absorption. In addition, the substrate holders 94 may hold the substrates 90 by vacuum sacking.

The robot arm 24 carries the substrate 90 loaded on the substrate cassettes 20 and the substrate holder 94 loaded on the substrate holder rack 22 to the pre-aligner 26. The robot arm 24 carries the substrate 90 held within the pre-aligner 26 on the substrate holders 94 to the alignment apparatus 28. In addition, the robot arm 24 turns over a set of a substrate holders 94 and a substrate 90 of two sets of a substrate holders 94 and a substrate 90 which are carried in series, and carries them. The robot arm 24, after being bonded, caries bonding substrates 95 which have been carried to the substrate holder rack 22, to any one of the substrate cassettes 20.

The pre-aligner 26 aligns the substrates 90 relative to the substrate holders 94 to load onto that substrate holder 94. The pre-aligner 26 relatively aligns the substrate 90 and the substrate holder 94, such that each of the substrates 90 are loaded within adjustment range of the alignment apparatus 28 which is narrow because of its high precision. This enables alignment apparatus 28 to align the substrates 90 together quickly and precisely.

The alignment apparatus 28 aligns a pair of substrates 90 to stack by means of positions of a plurality of alignment marks formed on one substrate 90 and positions of a plurality of alignment marks formed on the other substrate 90. The alignment apparatus 28 is disposed between the robot arm 24 and the robot arm 30. The alignment apparatus 28 comprises a frame 34, a fixed stage 36 and a moving stage 38 as an example of a moving section. The fixed stage 36 and the moving stage 38 are an example of an aligning section which aligns a pair of substrates.

The frame 34 is formed so as to surround the fixed stage 36 and the moving stage 38. Openings are formed on the side of the substrate cassettes 20 of the frame 34 and on the side of the vacuum environment section 16. This causes a substrate stack 93 that includes a pair of substrate holders 94 with a pair of stacked substrates 90 clamped from both the sides to be carried in and out through the openings.

The fixed stage 36 is provided opposing to the upper portion of the moving stage 38. The bottom surface of the fixed stage 36 vacuum-sucks and holds the substrate holders 94 to hold the substrate 90 which has been turned over by the robot arm 24 to be carried.

The top surface of the moving stage 38 vacuum-sucks the substrate holder 94 to hold, which holds the substrate 90 carried by the robot arm 24 without being turned over. The moving stage 38 moves in X-Y direction to move one substrate 90 of a pair of substrates 90 on the horizontal plane. This causes the moving stage 38 to align the substrate 90 on the fixed stage 36 and the substrate 90 on the moving stage 38. The moving stage 38 ascends to stack a pair of substrates 90 together which has been held in the substrate holder 94. Thereafter, a pair of substrates 90 is clamped by the substrate holders 94. By this, substrate stack 93 is formed, with a pair of stacked substrates 90 clamped by a pair of substrate holders 94. The substrate 90 and substrate 90 may be temporarily bonded with an adhesive, temporarily bonded by plasma, or simply stacked.

The robot arm 30 vacuum-sucks the substrate stack 93 to carry to the vacuum environment section 16. The robot arm 30 carries the substrate stack 93 that includes the bonding substrate 95, from the vacuum environment section 16 to the separation stage 39. The separation stage 39 separates the bonding substrate 95 and the substrate holders 94. The robot arm 31 carries the bonding substrate 95 and the substrate holder 94 to the substrate holder rack 22 separated on the separation stage 39, along the rail 32.

The vacuum environment section 16 is set to a vacuum state in the bonding process of the substrate bonding apparatus 10. The vacuum environment section 16 comprises a load lock room 48, an access door 50, a gate valve 52, a robot chamber 53, a robot arm 54, three housing rooms 55, three heating and pressuring apparatuses 56, a robot arm 58, and a cooling room 60. In addition, the number of the heating and pressuring apparatuses 56 is not limited to three and may be appropriately changed.

The load lock room 48 couples the atmosphere environment section 14 and the vacuum environment section 16. The load lock room 48 can be set to a vacuum state and atmospheric state. Openings are formed at the side of the atmosphere environment section 14 of the load lock room 48 and at the side of the vacuum environment section 16, to enable to carry in and out the substrate stack 93 that includes a pair of substrates 90 prior to bonding and the substrate stack 93 that includes the bonding substrate 95.

The access door 50 opens and closes the opening at the side of the atmosphere environment section 14 of the load lock room 48. The gate valve 52 opens and closes the opening at the side of the vacuum environment section 16 of the load lock room 48. The robot arm 54 is rotatably disposed around the robot chamber 53. The robot arm 54 carries the substrate stack 93 which has been carried to the load lock room 48 by the robot arm 30, to any one of the heating and pressuring apparatuses 56.

The housing room 55 has a gate valve 57 and is coupled to the robot chamber 53 via the gate valve 57. The housing room 55 has a gate valve 57 which is opened and closed in carrying in and out the substrate stack 93.

The three heating and pressuring apparatuses 56 are radially disposed around the robot chamber 53. The heating and pressuring apparatus 56 is coupled to robot chamber 53 via gate valve 57. The heating and pressuring apparatuses 56 heats and pressurizes the substrate stack 93 by putting it therebetween to bond a pair of substrates 90.

The robot arm 58 is rotatably disposed at the center of the robot chamber 53. This causes the robot arm 58 to carry the substrate stack 93 from the heating and pressuring apparatus 56 to the cooling room 60. The robot arm 58 also carries the substrate stack 93 from the cooling room 60 to the load lock room 48.

The cooling room 60 has cooling functionality. This causes the cooling room 60 to cool the substrate stack 93 which has been carried. The cooling room 60 is coupled to the robot chamber 53 via the gate valve 57.

Figure 2:
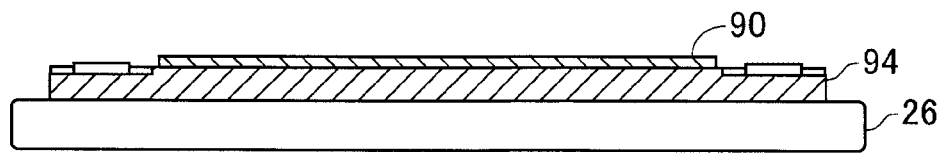
FIG. 2 is a diagram which describes the manufacturing method of a layered semiconductor apparatus 96 including a bonding process of bonding substrates 95 by means of substrate bonding apparatus 10.

FIGS. 2-5 are diagrams describing the manufacturing method of a layered semiconductor apparatus 96 including the bonding process of the bonding substrates 95 by means of the substrate bonding apparatus 10, in the bonding process, the robot arm 24 takes out the substrate holder 94 from the substrate holder rack 22 to carry to the pre-aligner 26. Subsequently, the robot arm 24 takes out the substrate 90 from any of the substrate cassettes 20 to carry to the pre-aligner 26. The pre-aligner 26 observes the appearance of the substrate 90 and the substrate holder 94 for aligning, and loads the substrate 90 on the substrate holder 94, as shown in FIG. 2. The substrate holder 94 absorbs the loaded substrate 90 to hold.

Figure 3:
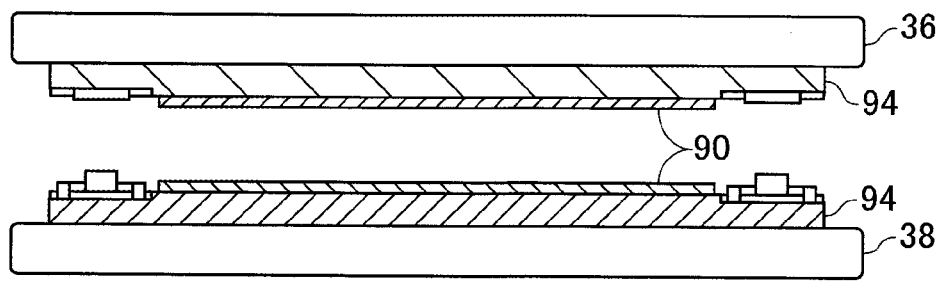
FIG. 3 is a diagram describing the manufacturing method of the layered semiconductor apparatus 96 including the bonding process of the bonding substrates 95 by means of the substrate bonding apparatus 10.

As shown in FIG. 3, the robot arm 24 turns the substrate 90 and the substrate holder 94 to carry to bottom surface of the fixed stage 36. The fixed stage 36 holds the substrate holder 94 along with the substrate 90 via vacuum-sucking.

The robot arm 24 carries the subsequent substrate 90 and substrate holder 94 to the pre-aligner 26. The robot arm 24 carries the substrate 90 and the substrate holder 94 which have been aligned in the pre-aligner 26, to the moving stage 38 without turning it over. The moving stage 38 holds the substrate 90 and the substrate holder 94. The moving stage 38 moves beneath the fixed stage 36. By this, the substrate 90 on the moving stage 38 and the substrate 90 on the fixed stage 36 are aligned by the alignment apparatus 28.

Figure 4:
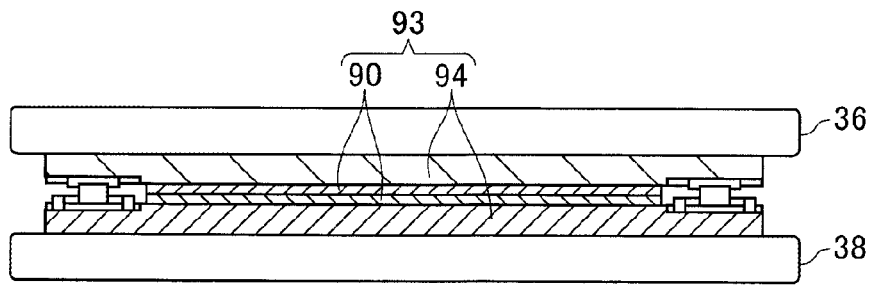
FIG. 4 is a diagram describing the manufacturing method of the layered semiconductor apparatus 96 including the bonding process of the bonding substrates 95 by means of the substrate bonding apparatus 10.

Subsequently, as shown in FIG. 4, the moving stage 38 moves upwardly, and the top surface of the substrate 90 on the moving stage 38 and the bottom surface of the substrate 90 on the fixed stage 36 are stacked, the substrate holders 94 absorbing each other via magnetic attraction. This causes the substrate stack 93 to be formed. After the fixed stage 36 cancels the absorption of the substrate stack 93, the robot arm 30 carries the substrate stack 93 on the moving stage 38 to the load lock room 48. The robot arm 54 carries the substrate stack 93 from the load lock room 48 to the heating and pressuring apparatus 56.

The heating and pressuring apparatus 56, after having heated the substrate stack 93 up to a bonding temperature, pressurizes the substrate stack 93 from upward and downward directions, while maintaining the bonding temperature. By this, a pair of substrates 90 in the substrate stack 93 is bonded to become a bonding substrate 95. Thereafter, if the temperature of the substrate stack 93 is lowered to a certain temperature, the robot arm 58 carries the substrate stack 93 to the cooling room 60. The cooling room 60 further cools the substrate stack 93. The robot arm 58 carries the cooled substrate stack 93 from the cooling room 60 to the load lock room 48.

Figure 5:
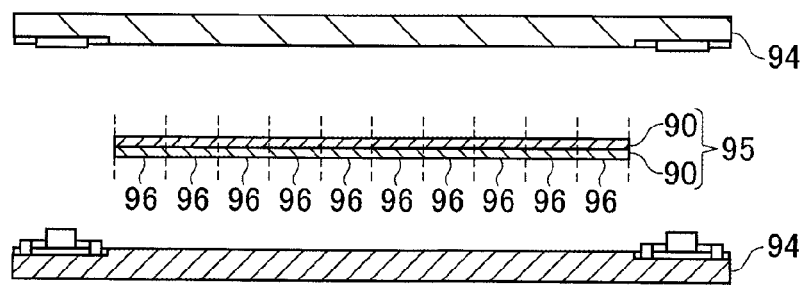
FIG. 5 is a diagram describing the manufacturing method of the layered semiconductor apparatus 96 including the bonding process of the bonding substrates 95 by means of the substrate bonding apparatus 10.

Subsequently, the robot arm 30 carries the substrate stack 93 from the load lock room 48 to the separation stage 39. The separation stage 39 separates the bonding substrates 95 of the substrate stack 93 from the substrate holders 94. The robot arm 31 carries the substrate holder 94 and the bonding substrates 95 to the substrate holder rack 22. The substrate holder rack 22 collects the substrate holder 94. The robot arm 24 carries out the bonding substrates 95 to the substrate cassettes 20. By this, the bonding process by the substrate bonding apparatus 10 is terminated, and the bonding substrate 95 has been brought to perfection. Thereafter, the bonding substrates 95 is divided into pieces along the dotted lines as shown in FIG. 5, bringing a layered semiconductor apparatus 96 into perfection.

Figure 6:
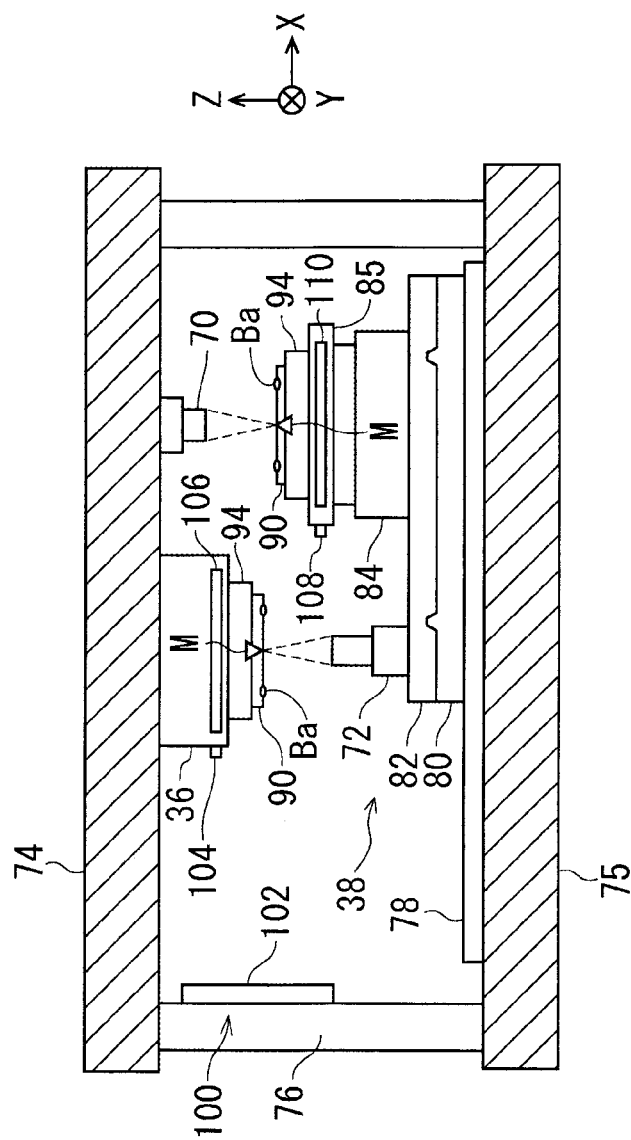
FIG. 6 is a side elevation view of an alignment apparatus 28.

FIG. 6 is a side elevation view of an alignment apparatus 28. X-Y-Z shown in FIG. 6 by arrows is X-Y-Z directions of the alignment apparatus 28. In addition to the frame 34, the fixed stage 36 and the moving stage 38 described above, the alignment apparatus 28 has an upper microscope 70, a lower microscope 72 and a position detecting section 100.

The frame 34 is formed so as to surround the fixed stage 36 and the moving stage 38. The frame 34 has a top plate 74, a bottom plate 75, and side walls 76. The top plate 74 and the bottom plate 75 are disposed, such that they are parallel to each other. The side walls 76 bond the top plate 74 and the bottom plate 75. On the surface of the substrate cassettes 20 of the side walls 76 and the surface of the vacuum environment section 16 of the side walls 76, there are openings to enable the substrate 90 and the bonding substrates 95 to be carried in and out.

The fixed stage 36 is fixed to the bottom surface of the top plate 74. The fixed stage 36 is provided in the position higher than the moving stage 38. The bottom surface of the fixed stage 36 vacuum-sucks the substrate holder 94 turned over by the robot arm 24, with the substrate 90 held. In addition, the bottom surface of the fixed stage 36 may electrostatically absorb the substrate holder 94.

The moving stage 38 is loaded on the top surface of the bottom plate 75. The moving stage 38 has a guide rail 78, an X stage 80, a Y stage 82, a lift member 84, and a fine motion stage 85.

The guide rail 78 is fixed to the bottom plate 75. The guide rail 78 extends in X direction. The X stage 80 is disposed on the guide rail 78. The X stage 80 is guided by the guide rail 78 to move in X direction. The Y stage 82 is disposed on the X stage 80. The Y stage 82 move in Y direction along the guide rail on the X stage 80. The lift member 84 is fixed to the top surface of the Y stage 82. The lift member 84 causes the fine motion stage 85 to ascend and descend.

The fine motion stage 85 is fixed to the top surface of the lift member 84. The top surface of the fine motion stage 85 vacuum-sucks the substrate holder 94 which holds the substrate 90. In addition, the top surface of the fine motion stage 85 may electrostatically absorb the substrate holder 94. A bump Ba disposed on the substrate 90 which has been absorbed to the fine motion stage 85 is electrically bonded with a bump Ba disposed on the substrate 90 which has been absorbed to the fixed stage 36. The fine motion stage 85 is moved to in X-Y-Z directions by the X stage 80, Y stage 82, and lift member 84. The fine motion stage 85 moves the substrate 90 and the substrate holder 94 which have been absorbed in X-Y direction, as well as rotates the substrate holder 94 and the substrate 90 around a lead direct-axis. In addition, the movement of the fine motion stage 85 in X-Y direction is of minute pitch and small movable range compared with the movement of the X stage 80 and Y stage 82. This enables the moving stage 38 to align the absorbed substrates 90 relative to the substrate 90 on the fixed stage 36 to stack together.

The upper microscope 70 is fixed to the top plate 74. The upper microscope 70 is spaced apart to the fixed stage 36. The upper microscope 70 observes an alignment mark M formed on the substrate 90 which has been absorbed to the fine motion stage 85 of the moving stage 38, and takes an image thereof. The alignment mark M disposed on the substrate 90 absorbed to the fine motion stage 85 is used to calculate the position of the substrate 90 for alignment in bonding the substrate 90 in the fixed stage 36. The alignment mark M is formed on the top surface of the substrate 90 which can be observed by the upper microscope 70. The upper microscope 70 outputs the image of the alignment mark M which has been imaged.

The lower microscope 72 is fixed on the Y stage 82 of the moving stage 38. The lower microscope 72 is spaced apart to the lift member 84. Therefore, the lower microscope 72 moves in X-Y direction together with the lift member 84 and fine motion stage 85. The lower microscope 72 observes an alignment mark M formed on the substrate 90 which has been absorbed to the fixed stage 36, and takes an image thereof. The alignment mark M is formed on the bottom surface of the substrate 90 which can be observed by the lower microscope 72. The lower microscope 72 outputs the image of the alignment mark M which has been imaged.

The position detecting section 100 output positional information which is the information on the position of the fixed stage 36 and moving stage 38. In other words, the position detecting section 100 outputs the positional information which is the information on the positions of the substrate 90 held in the fixed stage 36 and the substrate 90 held in the moving stage 38. That positional information is an example of the information on a pair of substrates in the aligning apparatus. The information on a relative position of a pair of substrates 90 includes the information on the position of the pair of substrates 90 which has been stacked. The position detecting section 100 comprises an interferometer 102, upper fixed mirrors 104, 106, and lower fixed mirrors 108, 110. The upper fixed mirrors 104, 106, and the lower fixed mirrors 108, 110 are an example of reflective members.

Figure 7:
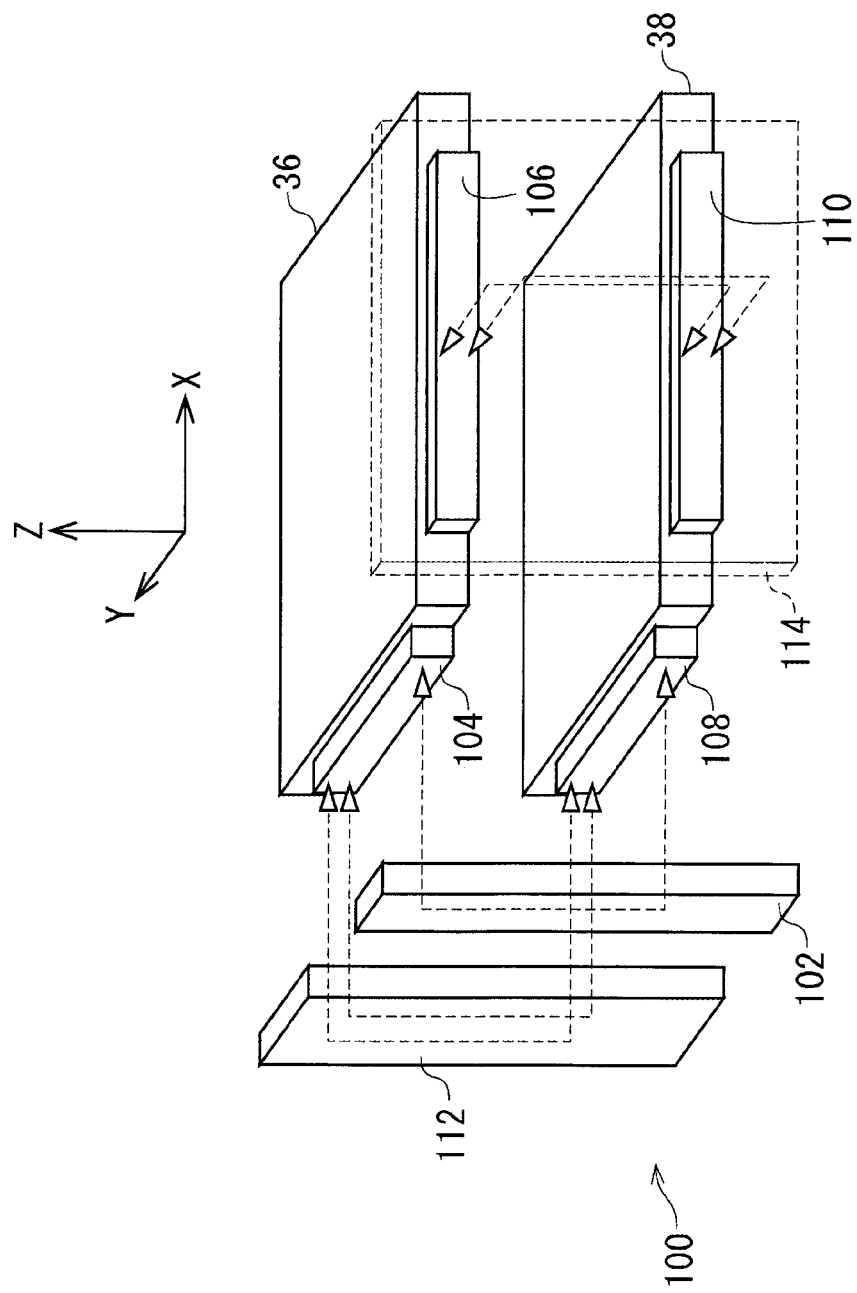
FIG. 7 is an entire perspective view around a position detecting section 100.

FIG. 7 is an entire perspective view around the position detecting section 100. As shown in FIG. 7, the position detecting section 100 further comprises interferometers 112, 114.

The upper fixed mirrors 104, 106 are fixed to the fixed stage 36. The lower fixed mirrors 108, 110 are fixed to the moving stage 38. The upper fixed mirror 104 and the lower fixed mirror 108 have a reflection plane parallel to the plane, with X direction as a perpendicular line. The upper fixed mirror 106 and the lower fixed mirror 110 have a reflection plane parallel to the X-Z plane, with Y direction as a perpendicular line.

The interferometer 102 is disposed so as to oppose to the upper fixed mirror 104 and the lower fixed mirror 108. The interferometer 102 emits a laser beam parallel to the X direction toward the upper fixed mirror 104 and the lower fixed mirror 108. The interferometer 102 detects and outputs amplitude of a signal which represents intensity of a laser beam due to interference of the laser beam reflected by the upper fixed mirror 104 and the lower fixed mirror 108, as positional information on a rotational direction around the lead direct-axis of the fixed stage 36 and the moving stage 38.

The interferometer 112 is disposed so as to oppose to the upper fixed mirror 104 and the lower fixed mirror 108. The interferometer 112 emits a laser beam parallel to the X direction to the upper fixed mirror 104 and the lower fixed mirror 108. The interferometer 112 detects and outputs amplitude of a signal which represents intensity of a laser bean due to interference of the laser beam reflected by the upper fixed mirror 104 and the lower fixed mirror 108, as positional information on temporal change in the positions of the fixed stage 36 and the moving stage 38 in X direction. That positional information is an example of temporal change in the position of a pair of substrates.

The interferometer 114 is disposed so as to oppose to the upper fixed mirror 106 and lower fixed mirror 110. The interferometer 114 emits a laser beam parallel to the Y direction toward the upper fixed mirror 106 and the lower fixed mirror 110. The interferometer 114 detects and outputs amplitude of a signal which represents intensity of a laser beam due to interference of the laser beam reflected by the upper fixed mirror 106 and the lower fixed mirror 110, as positional information on temporal change in the positions of the fixed stage 36 and the moving stage 38 in the Y direction. That positional information is an example of temporal change in the position of a pair of substrates.

Figure 8:
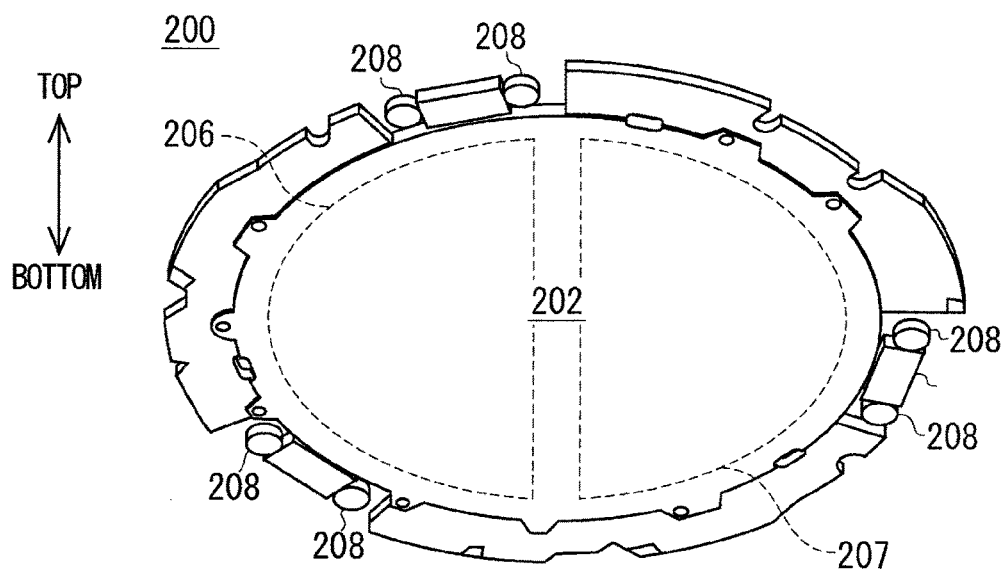
FIG. 8 is a perspective view, with an upper substrate holder 200 being one of substrate holders 94 seen from the bottom.

FIG. 8 is a perspective view, with an upper substrate holder 200 being one of the substrate holders 94 seen from the bottom. The top and bottom shown by arrows in FIG. 8 are upward and downward directions. As shown in FIG. 8, the upper substrate holder 200 has an upper loading portion 202, a pair of upper electrode pads 206, 207, and three pairs of bonding members 208 which is an example of a clamping section.

The upper loading portion 202 is made of a ceramic such as AlN. The upper loading portion 202 is formed in an approximately disk shape larger than the substrate 90 by one round. The bottom surface in the center of the upper loading portion 202 is formed in a planar shape. The bottom surface in the center of the upper loading portion 202 protrudes downwardly beyond the circumferential portion. The bottom surface in the center of the upper loading portion 202 serves as a loading plane on which the substrate 90 is loaded.

The upper electrode pads 206, 207 are formed in a semicircular shape. The upper electrode pads 206, 207 are embedded within the upper loading portion 202. One upper electrode pad 206 is disposed so as to be in line symmetry with the other upper electrode pad 207 with respect to the center of the upper loading portion 202. One upper electrode pad 206 is charged with a positive electric charge. The other upper electrode pad 207 is charged with a negative electric charge. This causes the upper electrode pads 206, 207 to occur electrostatic force to electrostatically absorb the substrate 90.

The three pairs of bonding members 208 are disposed in circumference of the upper loading portion 202. The three pairs of bonding members 208 are disposed in interval of approximately 120° in the circumferential direction. The bonding members 208 have a permanent magnet for bonding.

Figure 9:
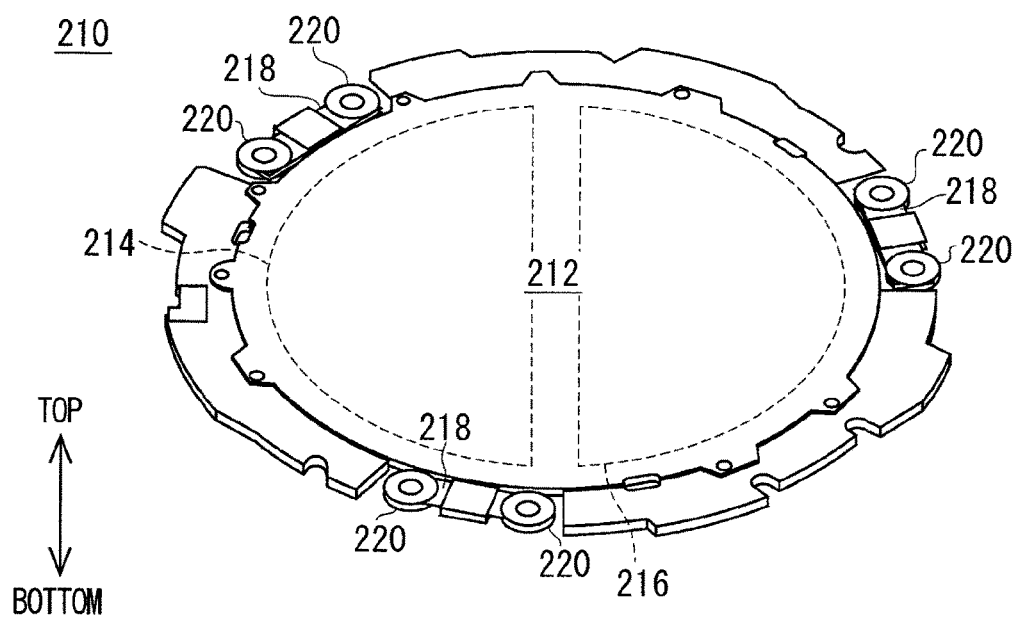
FIG. 9 is a perspective view, with a lower substrate holder 210 being the other one of the substrate holders 94 seen from above.

FIG. 9 is a perspective view, with a lower substrate holder 210 being the other one of the substrate holders 94 seen from above.

The top and bottom shown by arrows in FIG. 9 are upward and downward directions. As shown in FIG. 9, the lower substrate holder 210 has a lower loading portion 212, a pair of lower electrode pads 214, 216, lower elastic members 218, and bonded members 220 which are an example of a clamping section.

The lower loading portion 212 is formed in an approximately disk shape larger than the substrate 90 by one round. The top surface of the lower loading portion 212 is formed in a planar shape. The top surface in the center of the lower loading portion 212 protrudes upwardly beyond the circumferential portion. The top surface in the center of the lower loading portion 212 serves as a loading plane on which the substrate 90 is loaded. The lower loading portion 212 sandwiches a pair of substrates 90 between itself and the upper loading portion 202.

The lower electrode pads 214, 216 are formed in a semicircular shape. The lower electrode pads 214, 216 are embedded within the lower loading portion 212. One lower electrode pad 214 is disposed so as to surround the center of the lower loading portion 212 to be in line symmetry with the other lower electrode pad 216. One lower electrode pad 214 is charged with a negative electric charge. The other lower electrode pad 216 is charged with a positive electric charge. This causes the lower electrode pads 214, 216 to occur electrostatic force to electrostatically absorb the substrate 90.

The three lower elastic members 218 are disposed in circumference of the lower loading portion 212. The three lower elastic members 218 are disposed in interval of approximately 120° in the circumferential direction. The lower elastic members 218 are configured by springs which are elastically deformable. The lower elastic members 218 are formed in a rectangular form which is long in the circumferential direction.

Here, the lower elastic members 218 causes the bonding members 208 and the bonded members 220 to be bonded together, even if thickness of the substrate 90 sandwiched between the upper substrate holder 200 and the lower substrate holder 210 changes. Further, the lower elastic members 218 cause reaction force by elastic deformation to act as force to sandwich a pair of substrates 90 between the upper substrate holder 200 and the lower substrate holder 210.

The bonded members 220 include a material absorbed by a magnet, for example, a ferromagnetic material. The bonded members 220 are provided at ends of lower elastic members 218. The bonded members 220 are provided in the lower loading portion 212 via the lower elastic members 218. A pair of bonded members 220 is disposed in a position apposite the bonding members 208. Thus, if the bottom surface of the upper substrate holder 200 and the top surface of the lower substrate holder 210 approaches opposing to each other, the bonded members 220 are absorbed by the bonding members 208 and bonded together. As a result, the substrates 90 are clamped by the upper substrate holder 200 and the lower substrate holder 210. With the substrate held in this manner, the lower elastic members 218 is elastically deformed to appropriately adjust press pressure that acts on the substrate 90 from the upper substrate holder 200 and the lower substrate holder 210.

Figure 10:
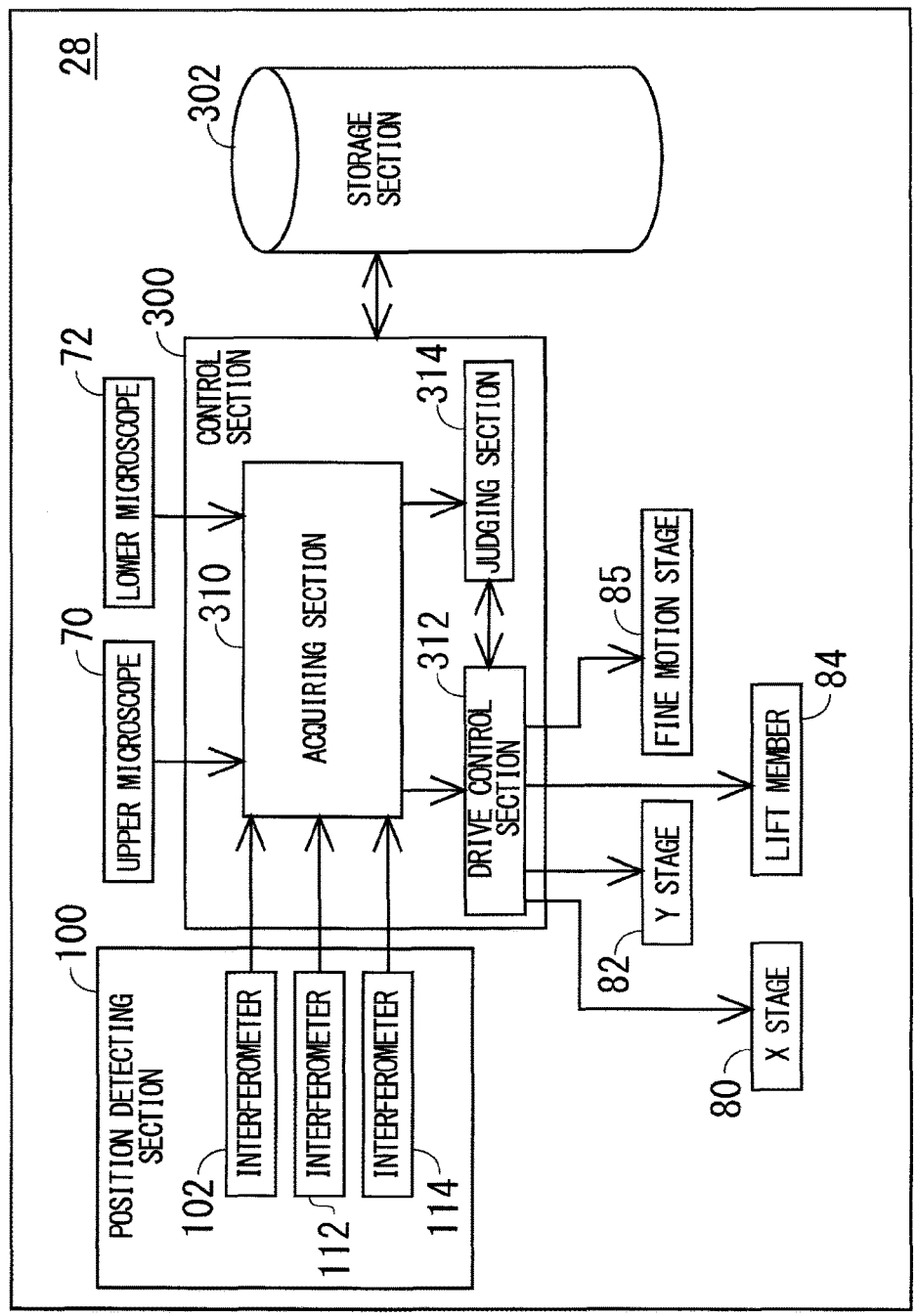
FIG. 10 is a block diagram of a control system of the alignment apparatus 28.

FIG. 10 is a block diagram of a control system of the alignment, apparatus 28. As shown in FIG. 10, the alignment apparatus 28 further comprises a control section 300 and storage section 302. An example of the control section 300 is a computer. The control section 300 serves as an acquiring section 310, a drive control section 312, and a judging section 314 by reading an alignment program stored in the storage section 302.

The acquiring section 310 acquires an image of alignment mark M from the upper microscope 70 and the lower microscope 72 to output to the drive control section 312. The acquiring section 310 acquires positional information from the interferometers 102, 112, 114 to output to the judging section 314.

The drive control section 312 acquires the image of the alignment mark M imaged by the upper microscope 70 and lower microscope 72 from the acquiring section 310. The drive control section 312 detects the position of the alignment mark M from the image of the alignment mark M. The drive control section 312 calculates a movement amount of the substrate 90 absorbed to the moving stage 38 where the position of alignment mark M on the substrate 90 on the fixed stage 36 and the position of the alignment mark M on the substrate 90 on the moving stage 38 are in the same position. The movement amount is indicated in (Sx, Sy, θ) depending on translation and rotational movement around the lead direct-axis of the moving stage 38 in the X-Y direction. Sx is the movement amount of the substrate 90 in the X direction. Sy is the movement amount of the substrate 90 in the Y direction. θ is a rotational amount of the substrate 90 around the lead direct-axis. Based on the calculated movement amount, the drive control section 312 drives the X stage 80, Y stage 82 and fine motion stage 85 on the moving stage 38 to align a pair of substrates 90. After aligning substrates 90 together, the drive control section 312 drives the lift member 84 to move the substrate 90 on the moving stage 38 upwardly, stacking the substrates 90 together.

After aligning via the fixed stage 36 and the moving stage 38, the judging section 314 judges whether there is misalignment of a pair of substrates 90, before it is carried out by the robot arm 30. Based on the information on a pair of substrates 90 within the alignment apparatus 28, the judging section 314 judges whether there is misalignment of a pair of substrates 90. The judging section 314 acquires from acquiring section 310, positional information which is an example of information in the alignment apparatus 28, the positional information output by the interferometers 102, 112, 114 in the position detecting section 100. Based on the acquired positional information, the judging section 314 judges the misalignment between a pair of substrates 90 after detecting that positional information. Specifically, the judging section 314 judges the occurrence of misalignment by comparing amplitude of light acquired from the position detecting section 100 and a judgement threshold which is a threshold to judge the occurrence of misalignment. The judgement threshold is set from a correlation of the amplitude and misalignment in the past. In addition, the interferometers 102, 112, 114 may detect the positional information on one substrate 90 of a pair of substrates 90, and the judging section 314 may judge whether there is misalignment based on the positional information on one substrate 90. Judging whether there is misalignment via the judging section 314 includes presuming whether there is misalignment which occurs after detecting the positional information based on the acquired positional information. The judgement threshold may be set depending on the timing of detection of the positional information.

Figure 11:
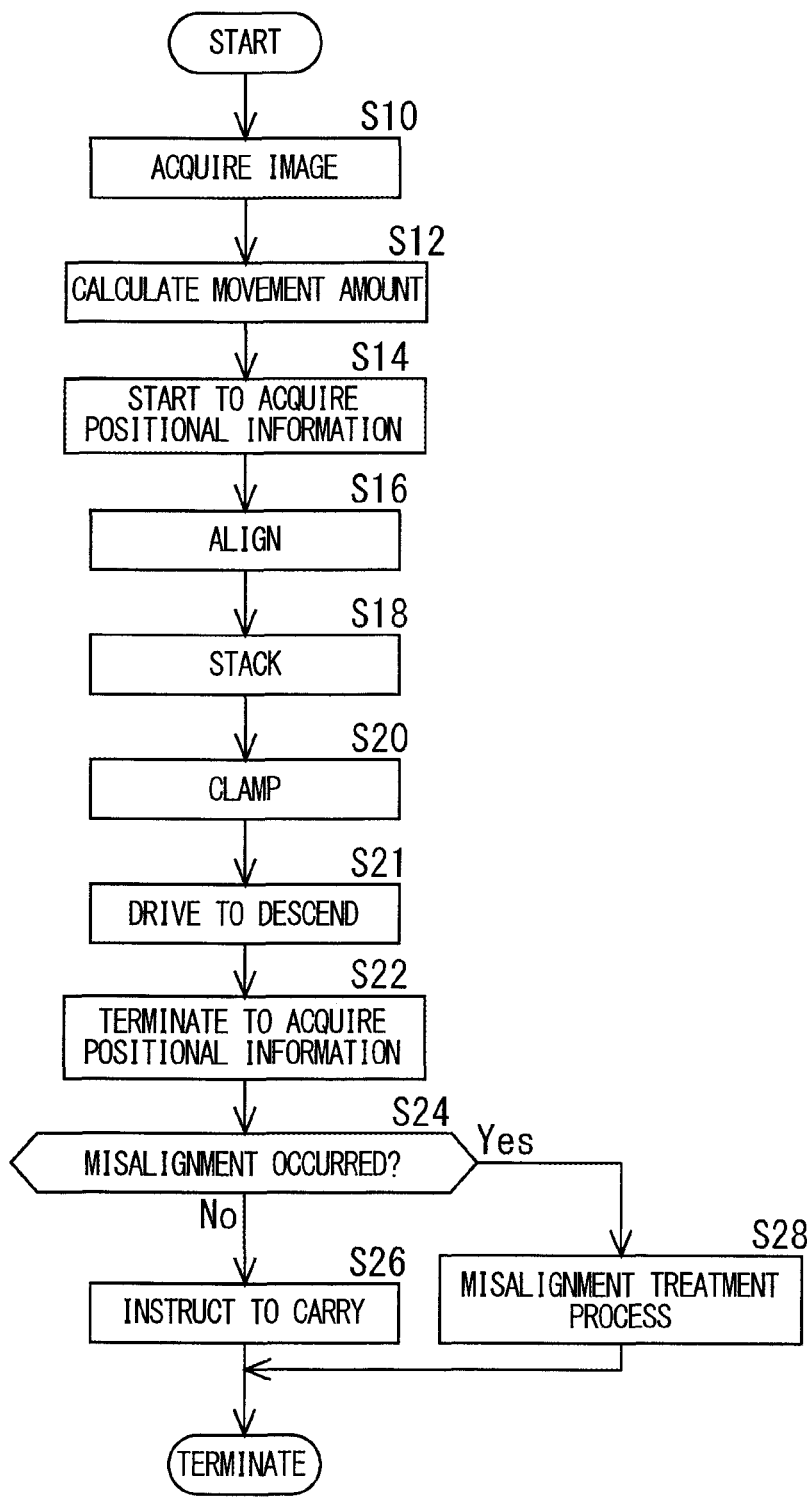
FIG. 11 is a flow chart describing an aligning process via the alignment apparatus 28.
Figure 12:
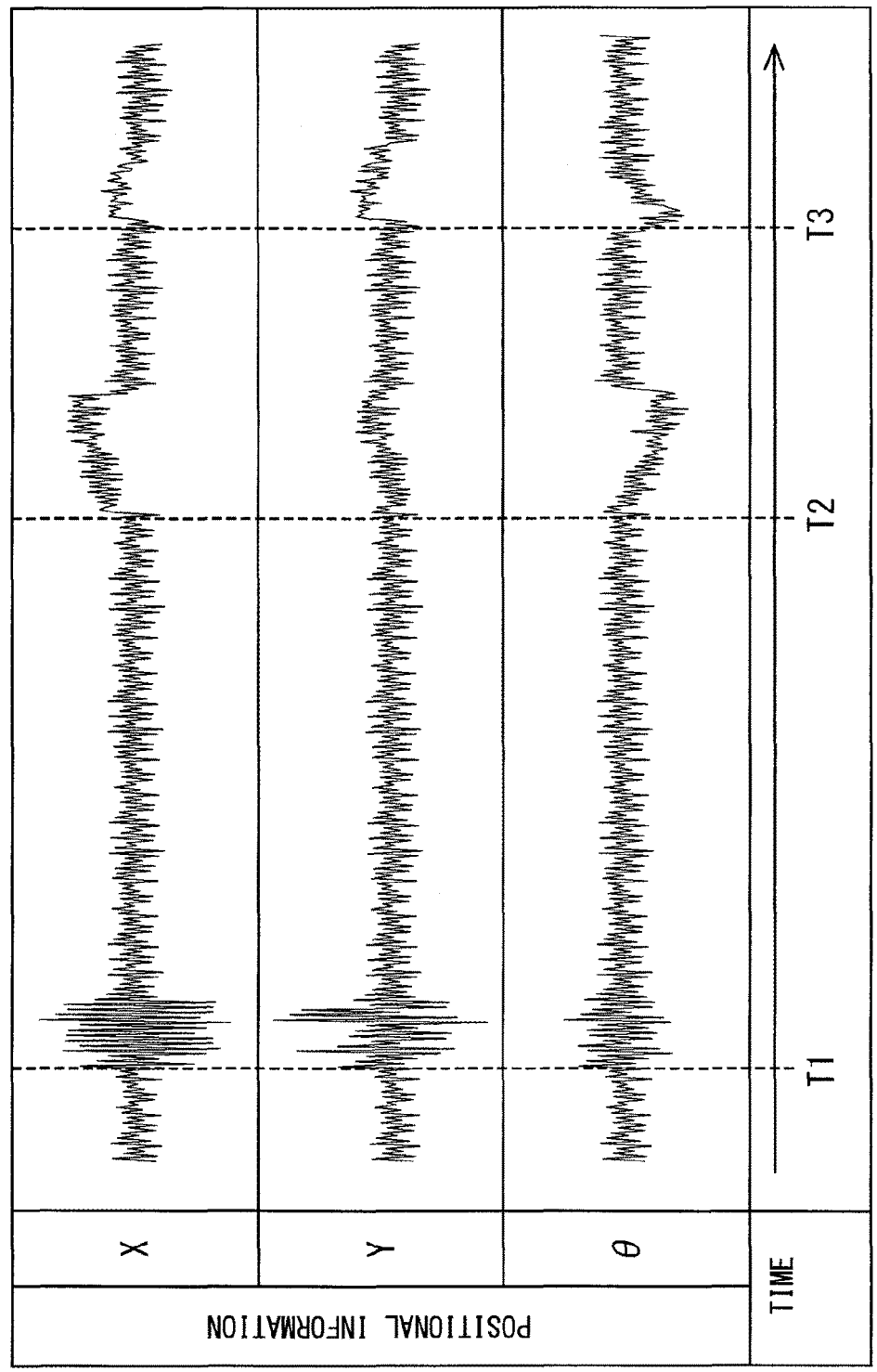
FIG. 12 is a diagram showing an example of positional information.

FIG. 11 is a flow chart describing an alignment process via the alignment apparatus 28. FIG. 12 is a diagram showing an example of the positional information acquired by the judging section 314 from the position detecting section 100. By the control section 300 in the alignment apparatus 28 reading the alignment program stored in the storage section 302, the alignment process is performed. In addition, the alignment process is started by the substrate 90, upper substrate holder 200, and lower substrate holder 210 being carried to each of the fixed stage 36 and moving stave 38. The bonded members 220 of the lower substrate holder 210 carried to the moving stage 38 are bound by the moving stage 38. This restricts the bonded members 220 moving in the X-Y direction and lead direct-axis direction.

As shown in FIG. 11, when the alignment process starts, the acquiring section 310 controls the upper microscope 70 and the lower microscope 72 to cause an alignment mark M to be imaged, acquiring the image (S 10). The acquiring section 310 outputs the image of the alignment mark M to the drive control section 312.

When the drive control section 312 acquires the image of the alignment mark M, the movement amount of substrates 90 is calculated, where the alignment mark M on the fixed stage 36 and the alignment mark on the moving stage 38 is in the same position in X-Y plane (S 12). Upon calculating the movement amount, the drive control section 312 outputs an initiation signal to the judging section 314.

Upon acquiring the initiation signal from the drive control section 312, the judging section 314 starts to acquire the positional information output from the interferometers 102, 112, 114 in the position detecting section 100 via the acquiring section 310 (S 14). The judging section 314 stores the acquired positional information into the storage section 302.

Having calculated the movement amount, the drive control section 312 moves the X stage 80, Y stage 82 and fine motion stage 85 on the moving stage 38 together with the substrates 90, based on the movement amount. This causes the drive control section 312 to align the substrates 90 together on the X-Y plane (S 16).

The drive control section 312 causes the fine motion stage 85 to ascend with the substrates 90 by driving the lift member 84. By this, the drive control section 312 stacks the substrate 90 on the fixed stage 36 and the substrate 90 on the moving stage 38 (S 18). As the bonded members 220 are bound by the moving stage 38, the bonded members 220 is not bonded with the bonding members 208 if the substrates 90 remain stacked.

The drive control section 312 cancels the binding of the bonded members 220 by the moving stage 38. This causes the drive control section 312 to clamp the substrates 90 with the pair of upper substrate holder 200 and lower substrate holder 210 (S 20). The drive control section 312 controls the lift member 84 to cause the moving stage 38 to descend (S 21). When the descending of the moving stage 38 has been terminated, the drive control section 312 outputs a termination signal to the judging section 314. The judging section 314 terminates to acquire the positional information (S 22).

Subsequently, the judging section 314 analyzes the positional information stored in the storage section 302 as shown in FIG. 12, and judges whether misalignment after detecting the positional information may occurs (S 24). In FIG. 12, a time T1 shows a time when the substrate 90 on the fixed stage 36 and the substrate 90 on the moving stage 38 get into contact, by the drive control section 312 ascending the fine motion stage 85. In other words, the positional information beyond the time T1 is the positional information when a pair of substrates 90 is in contact with each other. A time T2 shows a time when the drive control section 312 cancels the binding of the bonded members 220 by the moving stage 38 a pair of substrates 90 is clamped by the upper substrate holder 200 and the lower substrate holder 210. A time T3 is the time when the drive control section 312 causes the moving stage 38 to start to descend. It is also the time when the upper substrate holder 200 is detached from the fixed stage 36. It is understood from FIG. 12, that the amplitude gets large in the times T1, T2 and T3. In addition, the amplitude of a time when the robot arm 30 gets in contact with at least one of a pair of substrates 90 may be included in the positional information to judge whether there is misalignment, even beyond the time T3.

The judging section 314 judges occurrence of misalignment through the amplitude of the positional information. For example, the judging section 314 determines whether the maximum value of the amplitude in the times T1, T2 T3 is not less than the judgement threshold. If the maximum value of the amplitude in the neighborhood of the times T1, T2, T3 or the like is determined to be less than the judgement threshold which is a threshold for judging misalignment, the judging section 314 judges that misalignment will not occur (S 24: No), and outputs an instruction to carry to the control section 18 (S 26). By this, the robot arm 30 carries the aligned substrate stack 93 to the load lock room 48, and the alignment process is terminated.

On the other hand, if determining the maximum value of the amplitude to be not less than the judgement threshold, the judging section 314 judges that misalignment will occur (S 24: Yes), performs misalignment treatment process (S 28) and terminates the alignment process. An example of the misalignment treatment process is that the judging section 314 outputs an occurrence signal to the control section 18. By this, the control section 18 gets the speed of carrying the substrate stack 93 via the robot arms 30, 54 or the like, slower than usual, and carry it to the heating and pressuring apparatus 56 to restrain misalignment.

As discussed above, the judging section 314 judges occurrence of misalignment after detecting the positional information from the positional information acquired from the position detecting section 100, in the alignment apparatus 28. This can cause the alignment apparatus 28 perform processes to restrain misalignment, such as to slow conveyance from the alignment apparatus 28, for example. As a result, the substrate bonding apparatus 10 can enhance the precision of bonding the substrates 90.

Next, an alternative embodiment of the misalignment judgement method in the embodiments discussed above will be described.

The judging section 314 may calculate a moving average of the amplitude in the positional information and determine that misalignment will occur if that moving average is not less than judgement threshold. In addition, the moving average may be a simple moving average or may be a weighted moving average.

The judging section 314 may determine the occurrence of misalignment via a plurality of judgement thresholds. The judging section 314 may, for example, determine the occurrence of misalignment via a plurality of judgement thresholds set when the amplitude is detected as positional information. Specifically, the judging section 314 may determine the occurrence of misalignment via a first judgement threshold for the amplitude of a time predetermined from the time T1. Similarly, the judging section 314 may determine the occurrence of misalignment via a second judgement threshold and a third judgement thresholds for the amplitude in times predetermined from the times T2, T3, respectively. The predetermined time is an average one until the increase in amplitude in the times T1, T2, T3 gets stable, and is set empirically. In this embodiment, different values are set which are calculated from correlation of amplitude of light in the past and misalignment, respectively, for the first to third judgement thresholds. For example, in time T2, stress is likely to be accumulated in the lower elastic members 218 by starting to clamp. When this stress is released in conveyance, misalignment is likely to occur among the substrates 90. Therefore, for the second judgement threshold for the time T2, a smaller value is set than the first and third judgement threshold.

Further, different judgement thresholds may be set for X-Y direction and circumferential direction. For example, in the time 12 discussed above, the lower elastic members 218 that accumulates stress likely to be the reason for misalignment extends in an approximately circumferential direction of the substrate holder 94. Therefore, because misalignment is likely to occur in the circumferential direction in which stress may act with high probability, a smaller judgement threshold for θ direction is set than the judgement threshold for X-Y direction. For each of different directions, a judgement threshold may be weighted according to the probability of misalignment occurrence.

The judging section 314 may determine the occurrence of misalignment only via amplitude in a period of time when amplitude is predicted to be becomes large. For example, the judging section 314 may determine the occurrence of misalignment via the amplitude detected during a time predetermined from the times T1, T2, T3.

The judging section 314 may acquire the positional information, while judging the occurrence of misalignment simultaneous with that acquisition. This enables the judging section 314 to judge the occurrence of misalignment, such as immediately after the times T1, T2, T3. As a result, the alignment apparatus 28 can deal with misalignment. For example, upon judging the occurrence of misalignment, the drive control section 312 can align the substrates 90 again by causing the moving stage 38 to descend for stacking. This enables the alignment apparatus 28 to restrain misalignment after alignment.

The judging section 314 may detect the occurrence of misalignment when the positional information is acquired. For example, if the center of oscillation in the positional information deviates from a previous one, the judging section 314 determines that misalignment has occurred between the substrates 90. If the judging section 314 detects misalignment after alignment, the alignment apparatus 28 aligns a pair of substrates 90 again.

Next, an alternative embodiment of the misalignment treatment process in the embodiment discussed above will be described.

In the misalignment treatment process, the judging section 314 may output a conveyance signal for carrying out the substrate stack 93 to outside to the control section 18. By this, the robot arm 24 carries out the substrate stack 93 including substrates 90 which have not been bonded from the alignment apparatus 28 to the substrate cassette 20. Further, in other misalignment treatment process, the drive control section 312 may bring the bonded members 220 to the bonding members 208 in a slow speed for contacting, and then separate, when clamping. In still other misalignment treatment process, the drive control section 312 may bring the bonded members 220 to the bonding members 208, and then separate, when clamping. That is, in clamping, at least one of position and speed of the bonded members 220 is controlled so as to mitigate impact between the bonded members 220 and the bonding members 208. In this manner, the judging section 314, upon presuming that misalignment will occur, outputs so as to change the control by control section 18 to control the process after detecting the positional information.

Functions, connectional relationships, forms, numerals or the like of the configurations in the embodiments discussed above may be appropriately changed. Each embodiment may be combined.

For example, while the example in which the interferometers 102, 112, 114 detect the positional information on the substrate 90 in the embodiments discussed above, the position detecting section 100 may detect the positional information by means of a linear encoder, rotary encoder or the like.

Also, while the interferometers 102, 112, 114 acquire the positional information on the substrate 90 by detect the change in the position of the fixed stage 36 and moving stage 38 in the embodiments discussed above, the position detecting section 100 may detect the positional information on the substrate 90 via the interference of laser light reflected after being directly irradiated to the substrate 90.

The judging section 314 may combine a plurality of amplitudes to judge misalignment. For example, a value obtained by adding amplitude in the X-Y direction and a judgement threshold may be compared to judge misalignment.

The judging section 314 may estimate and judge factors of occurrence of misalignment by means of the shape of a signal that is the positional information, i.e., the waveform. For example, the judging section 314 estimates and judges by a waveform, factors of such as occurrence of misalignment in conveyance, occurrence of misalignment in the heating and pressuring apparatus 56, or the like, from a correlation of misalignment occurrence factors in the past and the waveform.

Data of the waveform measured in the past in misalignment occurrence may also be stored. In this case, the judging section 314 judges whether misalignment will occur by comparing the waveform detected and the waveform that is seen when misalignment occurs.

Further, the judging section 314 may judge that misalignment will occur, when size of amplitude to judge misalignment occurrence exceeding a predetermined threshold continues to occur for a period of time that exceeds the predetermined threshold.

In this case, the threshold is set by size of the amplitude and the period of time in which a predetermined size of amplitude continues to occur. The threshold of amplitude may be smaller than the thresholds shown in FIGS. 11 and 12. In this case, with the correlation of the amplitude and period of time measured in past with misalignment stored, the judging section 314 judges whether misalignment has occurred by comparing the stored data with the measured amplitude and the period of time.

While the example in which a pair of substrates is held by 90 a pair of substrate holders 94 in the embodiments discussed above, the embodiment of holding a pair of substrates 90 is not limited thereto. For example, a pair of substrates 90 may be held by one piece of substrate holder, and holding members such as clips provided in that substrate holder. In this case, the substrate holder, for example, will be disposed beneath the pair of substrates 90 to be held by the holding members pressing the pair of substrates from above. In the case of such an embodiment, a plurality of holding members are preferably provided, for example, at regular intervals in the circumference of the substrate holder, for example, about three pieces. The position detecting section 100 may set the position of the holding members to the positional information on the substrate 90. In this case, the interferometers can irradiate laser light to the holding members to acquire the positional information. The substrate holder may also hold at least one of the pair of substrates.

While in the embodiment discussed above, the positional information on the substrate 90 in a direction parallel to the plane of the pair of substrates 90, i.e., the X direction, Y direction, and θ direction has been used as the positional information on the substrates 90, the positional information on the substrates 90 is not limited thereto. For example, a vertical direction vertical to the plane of a pair of substrates, i.e., the positional information on the pair of substrates 90 in the Z direction may be used, the positional information on the substrate 90. The positional information in the Z direction can be detected and acquired by a load cell attached to the fixed stage 36, a linear encoder attached to the moving stage 38, and a Z interferometer that detects a position in the Z direction, or the like. In this case, the judging section 314 can detect oscillation in Z direction, if there is change in the positional information in the Z direction, even though it cannot be detected from the positional information on the X-Y-θ direction whether there is misalignment. The judging section 314 may judge that misalignment will occur, when the positional information on the Z direction is not less than the judgement threshold for Z direction. This enable the judging section 314 to presume occurrence of misalignment of the pair of substrates 90, as stress remains on a plate spring of the clamp and is released in conveyance thereafter, for example. The judging section 314 can also judge that breakage has been occurred on the substrate 90, when a condition continues in which the position in the Z direction continues to change. Further, the judging section 314 can more precisely modify alignment by combining positional information in the X-Y θ direction and Z direction to acquire three-dimensional positional information, when retrying to align.

In the alignment apparatus 28, a display section to display information on misalignment to a user may be provided. An example of the display section is a liquid crystal display device, an organic EL display device or the like. An example of information to be displayed by the display section is a deviation amount of misalignment occurred on a pair of substrates, a timing in which misalignment has occurred, whether alignment is to be performed, whether change in processes after aligning needs to be performed, proposals on the content of change in the processes and etc.

While the embodiment of the present invention has been described, the technical scope of the invention is not limited to the above described embodiment. It is apparent to persons skilled in the art that various alterations and improvements can be added to the above-described embodiment. It is also apparent from the scope of the claims that the embodiments added with such alterations or improvements can be included in the technical scope of the invention.

It should be understood that the order of performing each process in operations, procedures, steps and stages in apparatuses, systems, programs and methods shown in the Claims, specification and drawings is not explicitly described such as "earlier than", "prior to" or the like, and may be performed in any order, unless the output in a previous process is used for a later process. Even if "first", "subsequently" or the like are used to describe action flows in the Claims, specification, and drawings, this does not mean that it is necessary to perform in the order.

EXPLANATION OF REFERENCES

10: substrate bonding apparatus, 12: environment chamber, 14: atmosphere environment section, 16: vacuum environment section, 18: control section, 20: substrate cassettes, 22: substrate holder rack, 24: robot arm, 26: pre-aligner, 28: alignment apparatus, 30: robot arm, 31: robot arm, 32: rail, 34: frame, 36: fixed stage, 38: moving stage, 39: separation stage, 48: load lock room, 50: access door, 52: gate valve, 53: robot chamber, 54: robot arm, 55: housing room, 56: heating and pressuring apparatus, 57: gate valve, 58: robot arm, 60: cooling room, 70: upper microscope, 72: lower microscope, 74: top plate, 75: bottom plate, 76: side walls, 78: guide rail, 80: X stage, 82: Y stage, 84: lift member, 85: fine motion stage, 90: substrate, 93: substrate stack, 94: substrate holder, 95: bonding substrate, 96: layered semiconductor apparatus, 100: position detecting section, 102: interferometer, 104: upper fixed mirror, 106: upper fixed mirror, 108: lower fixed mirror, 110: lower fixed mirror, 112: interferometer, 114: interferometer, 200: upper substrate holder, 202: upper loading portion, 206: upper electrode pad, 207: upper electrode pad, 208: bonding member, 210: lower substrate holder, 212: lower loading portion, 214: lower electrode pad, 216: lower electrode pad, 218: lower elastic members, 220: bonded member, 300: control section, 302: storage section, 310: acquiring section, 312: drive control section, 314: judging section

What is claimed is:

1. A substrate aligning apparatus comprising:
    an aligning section that aligns a first substrate and a second substrate together;
    an acquiring section that acquires positional information on at least one of the first substrate and the second substrate; and
    a judging section that judges misalignment of the first substrate and the second substrate, based on whether an amplitude of the positional information acquired by the acquiring section is less than a threshold for judging occurrence of misalignment.

2. The substrate aligning apparatus according to claim 1, further comprising:
    a holding section that holds at least one of the first substrate and the second substrate, wherein
    the positional information includes information on a position of the holding section.

3. The substrate aligning apparatus according to claim 2, wherein
    the positional information includes information on a signal that shows light intensity due to interference of light reflected from a reflective member fixed to the holding section or the substrate.

4. The substrate aligning apparatus according to claim 3, wherein
    the judging section judges whether a maximum value of amplitude of the signal is not less than the threshold, and judges that misalignment will occur, if the maximum value is not less than the threshold.

5. The substrate aligning apparatus according to claim 3, wherein
    the positional information includes a waveform of the signal, and
    the judging section judges that misalignment will occur by comparing the waveform and a waveform that is seen when misalignment occurs.

6. The substrate aligning apparatus according to claim 1, wherein
    based on the positional information, the judging section presumes at least one of whether misalignment will occur on the first substrate and the second substrate after detecting the positional information, and a factor of occurrence of the misalignment.

7. The substrate aligning apparatus according to claim 1, wherein
    the judging section judges misalignment from the positional information in at least one of timings: when the first substrate and the second substrate which have been aligned gets in contact with each other; when a carrying section carrying out the first substrate and the second substrate which have been aligned from the aligning section gets in contact with at least one of the first substrate and the second substrate; and when the first substrate and the second substrate which have been aligned are clamped by a clamping section.

8. The substrate aligning apparatus according to claim 1, comprising:

a moving section which moves at least one of the first substrate and the second substrate; and a drive control section that drives the moving section to align the first substrate and the second substrate, wherein the drive control section aligns the first substrate and the second substrate again, if the judging section judges that the misalignment has occurred, or judges that the misalignment will occur.

9. The substrate aligning apparatus according to claim 1, wherein information on the first substrate and the second substrate includes information on temporal change in positions of the first substrate and the second substrate.

10. A substrate aligning apparatus comprising:

an aligning section that aligns a pair of substrates;

a holding section that holds at least one of the pair of substrates; and a judging section that judges whether there is misalignment of the pair of substrates which has been aligned by the aligning section, based on whether an amplitude of positional information of the holding section is less than a threshold for judging occurrence of misalignment.

11. The substrate aligning apparatus according to claim 1, wherein the aligning section temporarily stacks the first substrate and the second substrate.

12. The substrate aligning apparatus according to claim 1, wherein the aligning section electrically stacks a first circuit provided on the first substrate and a second circuit provided on the second substrate.

13. A substrate bonding apparatus comprising:

the substrate aligning apparatus according to claim 1; and a stacking section that stacks the first substrate and the second substrate together which have been aligned on the aligning apparatus.

14. A substrate aligning method comprising:

aligning a first substrate and a second substrate together in an aligning section;

acquiring positional information on at least one of the first substrate and the second substrate; and judging misalignment of the first substrate and the second substrate based on whether an amplitude of the positional information acquired in the acquisition is less than a threshold for judging occurrence of misalignment.

15. The substrate aligning method according to claim 14, wherein the positional information includes information on at least one of a position of a holding section that holds at least one of the first substrate and the second substrate, and a signal that shows light intensity due to interference of light reflected from a reflective member fixed to the holding section or the substrate.

16. The substrate aligning method according to claim 15, wherein the judging judges whether a maximum value of amplitude of the signal is not less than the threshold, and judges that misalignment will occur, if the maximum value is not less than the threshold.

17. The substrate aligning method according to claim 15, wherein the positional information includes a waveform of the signal, and the judging judges that misalignment will occur by comparing the waveform and a waveform that is seen when misalignment occurs.

18. The substrate aligning method according to claim 14, wherein based on the positional information, the judging presumes whether misalignment will occur on the first substrate and the second substrate after detecting the positional information.

19. The substrate aligning method according to claim 14, wherein the judging judges misalignment from the positional information in at least one of timings: when the first substrate and the second substrate which have been aligned get in contact with each other; when a carrying section carrying out the first substrate and the second substrate which have been aligned from the aligning section gets in contact with at least one of the first substrate and the second substrate; and when the first substrate and the second substrate which have been aligned are clamped by a clamping section.

20. The substrate aligning method according to claim 14, further comprising:

drive controlling by driving a moving section to move at least one of the first substrate or the second substrate to align the first substrate and the second substrate, wherein if the judging judges that the misalignment has occurred, or judges that the misalignment will occur, the first substrate and the second substrate are aligned again by the drive controlling.

21. The substrate aligning method according to claim 14, wherein information on the first substrate and the second substrate in the aligning section includes information on temporal change in positions of the first substrate and the second substrate.

22. A substrate aligning method comprising:

aligning a first substrate and second substrate in an aligning section;

judging whether there is misalignment of the first substrate and the second substrate that have been aligned in the aligning, based on whether an amplitude of positional information of a holding section that holds at least one of the first substrate and the second substrate is less than a threshold for judging occurrence of misalignment.

23. The substrate aligning method according to claim 14, wherein the aligning includes temporarily stacking the first substrate and the second substrate.

24. The substrate aligning method according to claim 14, wherein the aligning includes electrically stacking a first circuit provided on the first substrate and a second circuit provided on the second substrate.

25. A substrate bonding method comprising:

the substrate aligning method according to claim 14; and stacking the first substrate and the second substrate together that have been aligned by the aligning method.

* * * * *